(12) United States Patent
Venkatasubramanian et al.

(10) Patent No.: US 11,469,097 B2
(45) Date of Patent: Oct. 11, 2022

(54) CARBON HARD MASKS FOR PATTERNING APPLICATIONS AND METHODS RELATED THERETO

(71) Applicant: Applied Materials, Inc., Santa Clara, CA (US)

(72) Inventors: Eswaranand Venkatasubramanian, Santa Clara, CA (US); Yang Yang, San Diego, CA (US); Pramit Manna, Santa Clara, CA (US); Kartik Ramaswamy, San Jose, CA (US); Takehito Koshizawa, San Jose, CA (US); Abhijit Basu Mallick, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 180 days.

(21) Appl. No.: 17/045,453

(22) PCT Filed: Apr. 8, 2019

(86) PCT No.: PCT/US2019/026354
§ 371 (c)(1),
(2) Date: Oct. 5, 2020

(87) PCT Pub. No.: WO2019/199681
PCT Pub. Date: Oct. 17, 2019

(65) Prior Publication Data
US 2021/0043449 A1    Feb. 11, 2021

Related U.S. Application Data

(60) Provisional application No. 62/655,049, filed on Apr. 9, 2018.

(51) Int. Cl.
*H01L 21/02* (2006.01)
*C23C 16/26* (2006.01)
*H01L 21/033* (2006.01)

(52) U.S. Cl.
CPC ........ *H01L 21/02274* (2013.01); *C23C 16/26* (2013.01); *H01L 21/02115* (2013.01); *H01L 21/0332* (2013.01)

(58) Field of Classification Search
None
See application file for complete search history.

(56) References Cited

U.S. PATENT DOCUMENTS 5,470,661 A  *  11/1995  Bailey ................... G02B 1/105
                                                          428/408
6,900,002 B1     5/2005  Plat et al.
(Continued)

FOREIGN PATENT DOCUMENTS

| CN | 101064238 A | 10/2007 |
| JP | 2010024476 A | 2/2010 |

(Continued)

OTHER PUBLICATIONS

Taiwan Office Action dated Jan. 5, 2022 for Application No. 108112252.

(Continued)

*Primary Examiner* — Asok K Sarkar
(74) *Attorney, Agent, or Firm* — Patterson + Sheridan, LLP

(57) ABSTRACT

Embodiments herein provide methods of depositing an amorphous carbon layer using a plasma enhanced chemical vapor deposition (PECVD) process and hard masks formed therefrom. In one embodiment, a method of processing a substrate includes positioning a substrate on a substrate support, the substrate support disposed in a processing volume of a processing chamber, flowing a processing gas comprising a hydrocarbon gas and a diluent gas into the processing volume, maintaining the processing volume at a processing pressure less than about 100 mTorr, igniting and maintaining a deposition plasma of the processing gas by (Continued)

applying a first power to one of one or more power electrodes of the processing chamber, maintaining the substrate support at a processing temperature less than about 350° C., exposing a surface of the substrate to the deposition plasma, and depositing an amorphous carbon layer on the surface of the substrate.

20 Claims, 3 Drawing Sheets

(56) References Cited

U.S. PATENT DOCUMENTS

| | | |
|---|---|---|
| 7,166,336 B1 | 1/2007 | Mori et al. |
| 7,268,846 B2 | 9/2007 | Hwang et al. |
| 7,824,498 B2 | 11/2010 | Parkhe et al. |
| 7,942,111 B2 | 5/2011 | Burger et al. |
| 8,105,660 B2 | 1/2012 | Tudhope et al. |
| 8,119,240 B2 | 2/2012 | Cooper |
| 8,361,906 B2 | 1/2013 | Lee et al. |
| 8,852,348 B2 | 10/2014 | Parkhe et al. |
| 9,269,587 B2 | 2/2016 | Shimizu et al. |
| 9,412,613 B2 | 8/2016 | Manna et al. |
| 9,695,503 B2 | 7/2017 | Stowell et al. |
| 9,695,593 B2 | 7/2017 | Vokey et al. |
| 10,249,495 B2 | 4/2019 | Yang et al. |
| 10,544,505 B2 | 1/2020 | Yang et al. |
| 2001/0032591 A1 | 10/2001 | Carducci et al. |
| 2003/0180459 A1 | 9/2003 | Redeker et al. |
| 2004/0026235 A1 | 2/2004 | Stowell |
| 2004/0045934 A1 | 3/2004 | Harvey et al. |
| 2004/0261720 A1 | 12/2004 | Tolmachev et al. |
| 2005/0056940 A1* | 3/2005 | Sandhu ............... H01L 21/0332 257/E21.232 |
| 2005/0279624 A1 | 12/2005 | Brcka |
| 2006/0093803 A1 | 5/2006 | Hwang et al. |
| 2006/0246290 A1 | 11/2006 | Oda et al. |
| 2006/0264063 A1 | 11/2006 | Stern et al. |
| 2007/0104867 A1 | 5/2007 | Haba |
| 2007/0275569 A1 | 11/2007 | Moghadam et al. |
| 2008/0053819 A1 | 3/2008 | Hong et al. |
| 2008/0085604 A1 | 4/2008 | Hoshino et al. |
| 2008/0099326 A1 | 5/2008 | Ye et al. |
| 2008/0188090 A1 | 8/2008 | Chen et al. |
| 2008/0194169 A1 | 8/2008 | Sterling et al. |
| 2008/0277063 A1 | 11/2008 | Shin |
| 2009/0029067 A1 | 1/2009 | Sciamanna et al. |
| 2009/0047760 A1 | 2/2009 | Yamazaki et al. |
| 2009/0186206 A1 | 7/2009 | Ito et al. |
| 2009/0212010 A1 | 8/2009 | Wang et al. |
| 2010/0093187 A1 | 4/2010 | Lee et al. |
| 2010/0095979 A1 | 4/2010 | Hua et al. |
| 2010/0218785 A1 | 9/2010 | Green et al. |
| 2010/0291713 A1 | 11/2010 | Lee et al. |
| 2011/0005681 A1 | 1/2011 | Savas et al. |
| 2011/0017424 A1 | 1/2011 | Parkhe et al. |
| 2011/0136286 A1 | 6/2011 | Stewart et al. |
| 2011/0274852 A1 | 11/2011 | Ito et al. |
| 2011/0287633 A1 | 11/2011 | Lee et al. |
| 2012/0237693 A1 | 9/2012 | Jackson et al. |
| 2012/0276743 A1 | 11/2012 | Won et al. |
| 2013/0008603 A1 | 1/2013 | Eto et al. |
| 2013/0034666 A1 | 2/2013 | Liang |
| 2013/0146443 A1 | 6/2013 | Papa et al. |
| 2013/0160794 A1 | 6/2013 | Griffith Cruz et al. |
| 2013/0302996 A1 | 11/2013 | Reilly et al. |
| 2014/0054658 A1 | 2/2014 | Ma et al. |
| 2014/0170853 A1 | 6/2014 | Shamma et al. |
| 2014/0273461 A1 | 9/2014 | Lee et al. |
| 2014/0345802 A1 | 11/2014 | Umehara et al. |
| 2014/0355912 A1 | 12/2014 | Fortune |
| 2015/0200094 A1 | 7/2015 | Underwood et al. |
| 2015/0348824 A1 | 12/2015 | Kuenle et al. |
| 2015/0371851 A1 | 12/2015 | Lee et al. |
| 2016/0042961 A1 | 2/2016 | Dorf et al. |
| 2016/0053366 A1 | 2/2016 | Stowell et al. |
| 2016/0179005 A1 | 6/2016 | Shamma et al. |
| 2016/0276134 A1 | 9/2016 | Collins et al. |
| 2016/0284538 A1 | 9/2016 | Reilly et al. |
| 2016/0372307 A1 | 12/2016 | Yang et al. |
| 2017/0040140 A1 | 2/2017 | Tanaka et al. |
| 2017/0069464 A1 | 3/2017 | Ye et al. |
| 2017/0103893 A1 | 4/2017 | Kulshreshtha et al. |
| 2017/0330734 A1 | 11/2017 | Lee et al. |
| 2017/0372899 A1 | 12/2017 | Yang et al. |
| 2018/0096843 A1 | 4/2018 | Kulshreshtha et al. |
| 2018/0274089 A1 | 9/2018 | Yang et al. |
| 2018/0274100 A1 | 9/2018 | Yang et al. |
| 2018/0358222 A1 | 12/2018 | Venkatasubramanian et al. |
| 2018/0358229 A1 | 12/2018 | Koshizawa et al. |
| 2019/0057839 A1 | 2/2019 | Kellogg et al. |
| 2019/0057862 A1 | 2/2019 | Yang et al. |
| 2019/0122889 A1 | 4/2019 | Kulshreshtha et al. |
| 2019/0228970 A1 | 7/2019 | Yang et al. |
| 2020/0144029 A1 | 5/2020 | Gandikota et al. |

FOREIGN PATENT DOCUMENTS

| | | |
|---|---|---|
| JP | 2018536287 A | 12/2018 |
| KR | 20110115291 A | 10/2011 |
| KR | 20120121340 A | 11/2012 |
| TW | 468209 B | 12/2001 |
| TW | 200937517 A | 9/2009 |
| TW | 201204862 A | 2/2012 |
| TW | 201204862 A1 | 2/2012 |
| TW | 201438062 A | 10/2014 |
| TW | 201503228 A | 1/2015 |
| TW | 201730962 A | 9/2017 |
| TW | 201740539 | 11/2017 |
| TW | 201809339 A | 3/2018 |
| WO | 2019199681 A1 | 10/2019 |
| WO | 2019212592 A1 | 11/2019 |

OTHER PUBLICATIONS

Taiwan Office Action dated Mar. 12, 2020, for Taiwan Patent Application No. 108112252.

International Search Report and the Written opinion of the International Searching Authority for PCT/US2019/016354 dated Jul. 23, 2019, 12 pages.

Taiwan Office Action dated Oct. 22, 2020, for Taiwan Patent Application No. 108112252.

Ban et al. "Diamond-like carbon films deposited by electron beam excited plasma chemical vapor deposition," Diamond and Related Materials, vol. 11, No. 7, Jul. 2002, pp. 1353-1359, <https://doi.org/10.1016/S0925-9635(01) 00743-9>.

Ban et al. "Stress and structural properties of diamond-like carbon films deposited by electron beam excited plasma CVD," Diamond and Related Materials, vol. 12, No. 1, Jan. 2003, pp. 47-56, <https://doi.org/10.1016/S0925-9635 (02)00265-0>.

Moushinho et al. "High density plasma chemical vapor deposition of diamond-like carbon films," Microelectronics Journal, vol. 34, Nos. 5-8, May-Aug. 2003, pp. 627-629, <https://doi.org/10.1016/S0026-2692(03)00065-X>.

* cited by examiner

CARBON HARD MASKS FOR PATTERNING APPLICATIONS AND METHODS RELATED THERETO

BACKGROUND

Field

This application is a National Phase Application under 35 U.S.C. 371 of International Application No. PCT/US2019/026354, filed Apr. 8, 2019, which claims priority to U.S. Provisional Patent Application No. 62/655,049 filed Apr. 9, 2018, each of which is incorporated by reference in their entireties.

Description of the Related Art

Carbon hard masks formed of amorphous carbon are used in semiconductor device manufacturing as an etching mask in forming high aspect ratio openings (e.g., a height to width ratio of 2:1 or more) in a substrate surface or in a material surface layer thereof. Generally, processing issues related to forming high aspect ratio openings, including clogging, hole-shape distortion, pattern deformation, top critical dimension blow up, line bending, and profile bowing are a result of undesirable material properties of conventionally deposited carbon hard masks. For example, carbon hard masks having one or a combination of lower material density and lower material rigidity (i.e., Young's modulus) are known to cause increased deformation of high aspect ratio openings when compared to hard mask materials having a higher density or higher rigidity. Likewise, both lower etch selectivity between hard mask materials and a to be etched substrate material disposed therebeneath and hard mask materials having higher film stress (compressive or tensile) are known to cause increased slit pattern deformation and line bending when compared to processes using hard mask materials with higher etch selectivity to the underlying substrate material and lower film stress. Further, as critical dimensions (CDs) shrink and the heights of high aspect ratio openings increase, the thickness of conventionally deposited carbon hardmask used to form the high aspect ratio openings also increases. Unfortunately, hard masks having lower transparency due to one or both of low optical K and increased thickness can cause alignment problems in subsequent photolithography processes. Hard mask materials with higher etch selectivity to the underlying substrate materials allow for reduced thickness compared to hard masks with lower etch selectivity and are therefore desirable. Further, processes having lower etch selectivity between the hard mask material and the underlying substrate material often rely upon relativity thicker hard masks which undesirably increase processing time and cost to deposit, leading to reduced substrate processing capacity and increased device costs.

Accordingly, what is needed in the art are improved amorphous carbon hard masks and improved methods of forming improved amorphous carbon hard masks.

SUMMARY

Embodiments of the present disclosure generally describe methods of depositing an amorphous carbon layer onto a substrate, including over previously formed layers on the substrate, using a plasma enhanced chemical vapor deposition (PECVD) process and hard masks formed therefrom.

In one embodiment, a method of processing a substrate includes positioning a substrate on a substrate support, the substrate support disposed in a processing volume of a processing chamber, flowing a processing gas comprising a hydrocarbon gas and a diluent gas into the processing volume, maintaining the processing volume at a processing pressure less than about 100 mTorr, igniting and maintaining a deposition plasma of the processing gas by applying a first power to one of one or more power electrodes of the processing chamber, maintaining the substrate support at a processing temperature less than about 350° C., exposing a surface of the substrate to the deposition plasma, and depositing an amorphous carbon layer on the surface of the substrate.

In another embodiment, a method of processing a substrate includes positioning a substrate on a substrate support, the substrate support disposed in a processing volume of a processing chamber, flowing a processing gas comprising a hydrocarbon gas and a diluent gas into the processing volume, maintaining the processing volume at a processing pressure less than about 20 mTorr, igniting and maintaining a deposition plasma of the processing gas by applying a first ac power one of one or more power electrodes of the substrate support, wherein the first ac power is between about 0.7 watts and about 15 watts per $cm^2$ of a substrate receiving surface of the substrate support, maintaining the substrate support at a processing temperature less than about 100° C., exposing a surface of the substrate to the deposition plasma, and depositing an amorphous carbon layer on the surface of the substrate.

In another embodiment, a carbon hard mask includes an amorphous carbon layer disposed on a surface of a substrate, wherein the amorphous carbon layer has a density of more than about 1.8 $g/cm^3$, a Young's modulus of more than about 50 GPa, a film stress less than about 500 MPa, and an absorption coefficient (optical K) of less than about 0.15 at a wavelength of about 633 nm.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of scope, for the disclosure may admit to other equally effective embodiments.

DETAILED DESCRIPTION

Embodiments of the present disclosure generally describe methods for depositing an amorphous carbon layer onto a substrate, including over previously formed layers on the substrate, using a plasma enhanced chemical vapor deposition (PECVD) process. In particular, the methods described herein provide for lower processing pressures, e.g., less than about 100 mTorr, lower processing temperatures e.g., less than about 350° C., and higher powers, e.g., more than about 1000 W, than typically used in conventional methods of depositing amorphous carbon layers. In some embodiments herein, the power used to ignite and maintain the deposition plasma is delivered to one or more power electrodes disposed in or coupled to a substrate support having the substrate disposed thereon. Each or combinations of lower processing pressures, lower processing temperatures, higher powers, and substrate level plasma (plasma formed through capacitive coupling with power electrodes of the substrate support) increase the ion energy at the substrate surface during deposition which results in an amorphous carbon layer having a desirably higher ratio of sp3 content (diamond like carbon) to sp2 content (graphite like carbon) when compared to conventional deposition methods. Because of the resulting higher sp3 content, the methods described herein provide amorphous carbon layers having improved density, rigidity, transparency, etch selectivity, and film stress when compared to conventionally deposited amorphous carbon layers.

Figure 1:
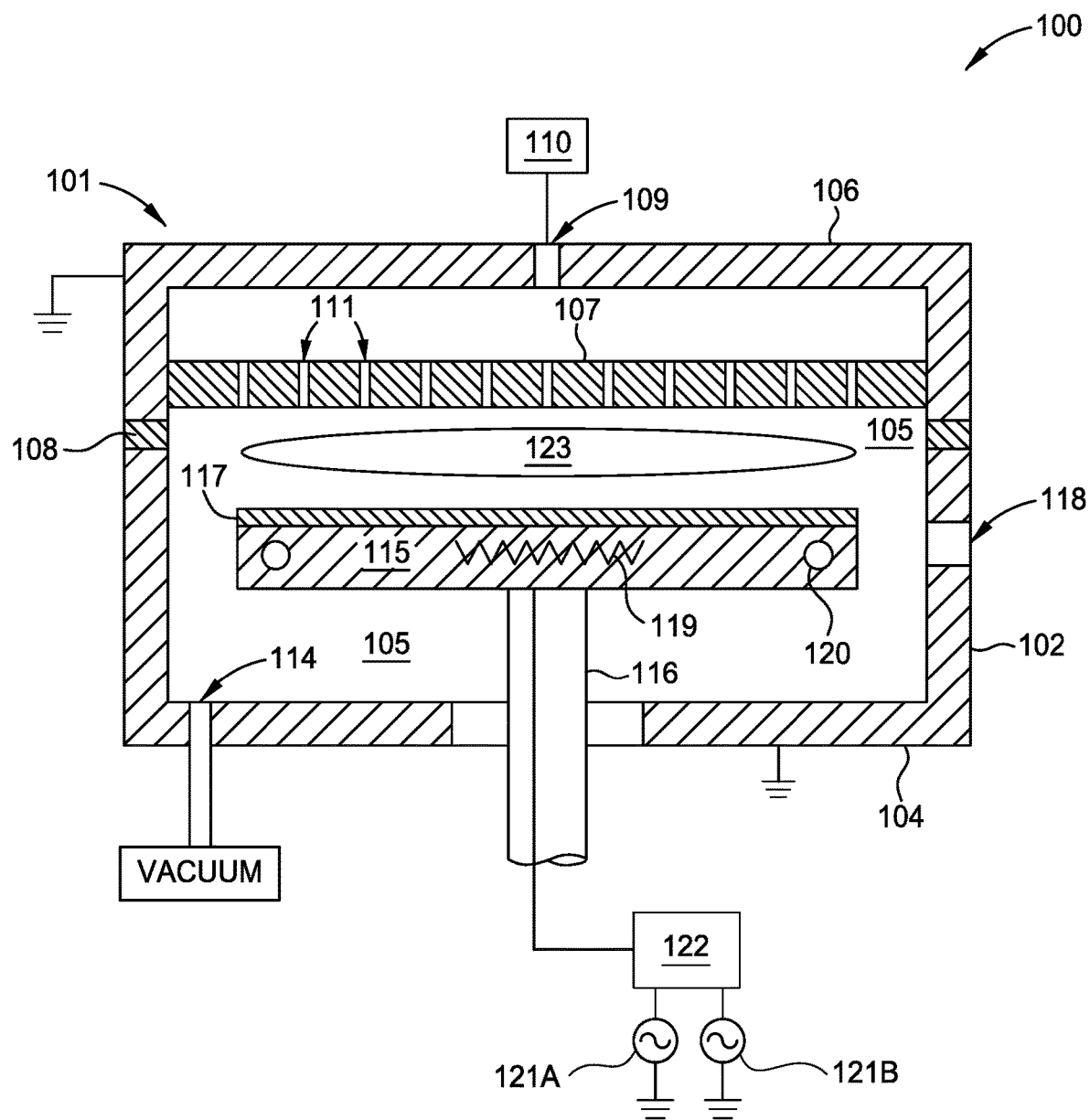
FIG. 1 is a schematic cross sectional view of an exemplary processing chamber used to practice the methods set forth herein, according to one embodiment.

FIG. 1 is a schematic cross sectional view of an exemplary processing chamber used to practice the methods set forth herein, according to one embodiment. Other exemplary processing chambers that may be used to practice the methods describe herein include Radion®, Producer®, and SYM3® processing chambers available from Applied Materials, Inc., of Santa Clara, Calif. as well as suitable deposition chambers from other manufacturers.

The processing chamber 100 includes a chamber lid assembly 101, one or more sidewalls 102, and a chamber base 104. The chamber lid assembly 101 includes a chamber lid 106, a showerhead 107 disposed in the chamber lid 106 and electrically coupled thereto, and an electrically insulating ring 108, disposed between the chamber lid 106 and the one or more sidewalls 102. The showerhead 107, the one or more sidewalls 102, and the chamber base 104 together define a processing volume 105. A gas inlet 109, disposed through the chamber lid 106 is fluidly coupled to a gas source 110. The showerhead 107, having a plurality of openings 111 disposed therethrough, is used to uniformly distribute processing gases from the gas source 110 into the processing volume 105. Herein, the chamber lid assembly 101, and thus the showerhead 107, is electrically coupled to an earthen ground. In other embodiments, the chamber lid assembly 101, and thus the showerhead 107 disposed therein, is electrically coupled to a power supply (not shown), such as a continuous wave (CW) RF power supply, a pulsed RF power supply, a DC power supply, a pulsed DC power supply, or a combination thereof, which deliver one or more bias voltages thereto. In other embodiments, the processing chamber 100 does not include a showerhead 107 and processing gases are delivered to the processing volume 105 through one or more gas inlets disposed through the chamber lid 106 or the one or more sidewalls 102.

Herein, the processing volume 105 is fluidly coupled to a vacuum source, such as to one or more dedicated vacuum pumps, through a vacuum outlet 114, which maintains the processing volume 105 at sub-atmospheric conditions and evacuates the processing gas and other gases therefrom. A substrate support 115, disposed in the processing volume 105, is disposed on a movable support shaft 116 sealingly extending through the chamber base 104, such as being surrounded by bellows (not shown) in the region below the chamber base 104. Herein, the processing chamber 100 is configured to facilitate transferring of a substrate 117 to and from the substrate support 115 through an opening 118 in one of the one or more sidewalls 102, which is sealed with a door or a valve (not shown) during substrate processing.

Typically, the substrate 117, disposed on the substrate support 115, is maintained at a desired processing temperature using one or both of a heater, such as a resistive heating element 119, and one or more cooling channels 120 disposed in the substrate support 115. The one or more cooling channels 120 are fluidly coupled to a coolant source (not shown), such as a modified water source having relatively high electrical resistance or a refrigerant source.

In some embodiments, one or more power electrodes (not shown) embedded in a dielectric material of the substrate support 115 or coupled thereto are coupled to one or more RF or other ac frequency power supplies, such as the first power supply 121A and the second power supply 121B, through a matching circuit 122. Herein, a deposition plasma 123 is ignited and maintained in the processing volume 105 by capacitively coupling processing gases therein with one of one or more power electrodes at an ac power delivered thereto from the first power supply 121A. In some embodiments, the deposition plasma 123 is further maintained by capacitive coupling with one of the one or more power electrodes at an ac power delivered thereto from the second power supply 121B. Herein, the first power supply 121A and the second power supply 121B each deliver an ac power having a frequency between about 350 kHz and about 100 MHz, where the frequency of the power from the first power supply 121A is different than a frequency from the second power supply 121B.

Figure 2:
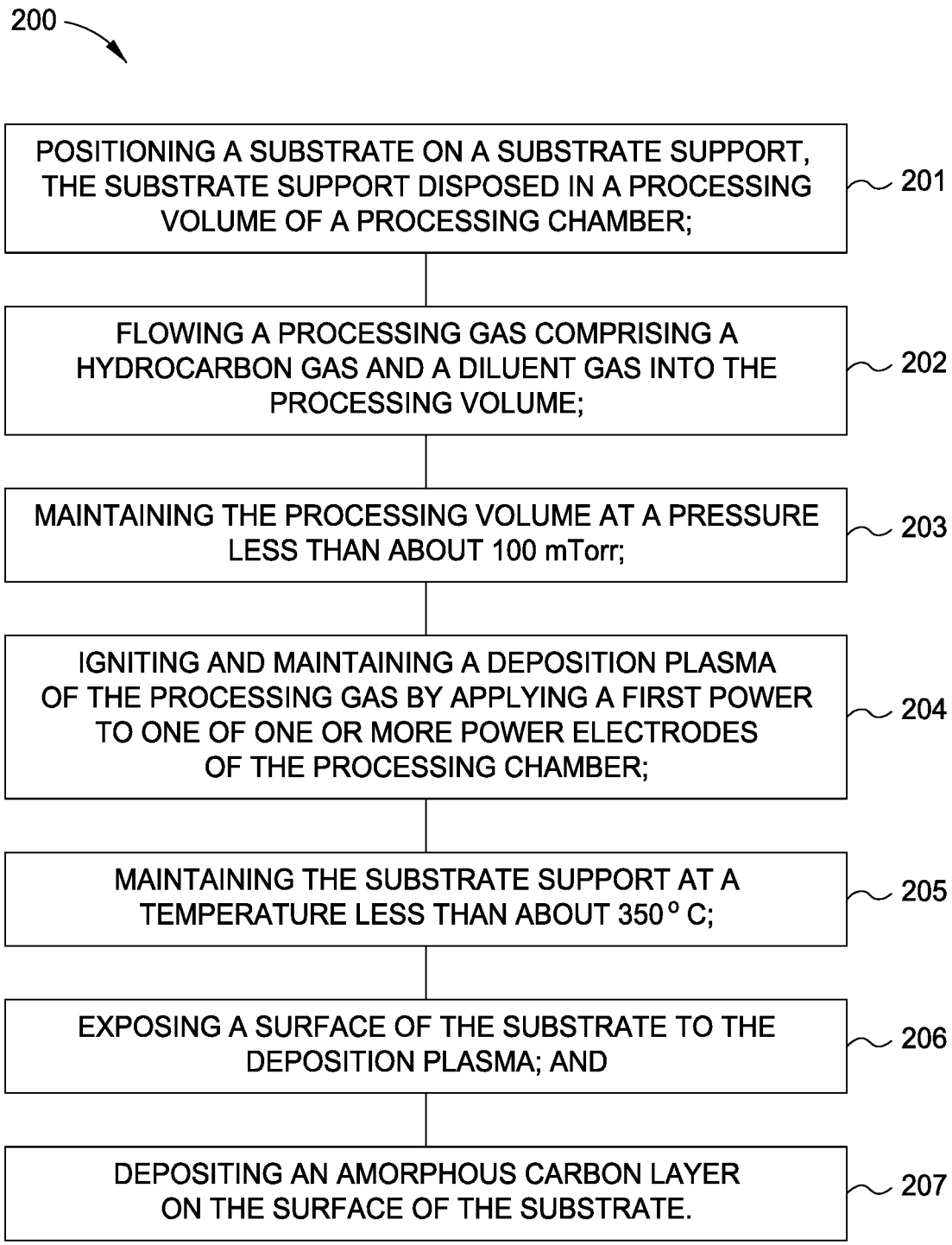
FIG. 2 is a flow diagram of a method of depositing an amorphous carbon layer, according to one embodiment.

FIG. 2 is a flow diagram of a method of depositing an amorphous carbon layer on a surface of a substrate, according to one embodiment. At activity 201 the method 200 includes positioning a substrate on a substrate support. Herein, the substrate support is disposed in a processing volume of a processing chamber, such as the processing chamber 100 described in FIG. 1. At activity 202 the method 200 includes flowing a processing gas into the processing volume. Typically, the processing gas includes a carbon source gas, such as a hydrocarbon gas, for example $CH_4$, $C_2H_2$, $C_3H_8$, $C_4H_{10}$, $C_2H_4$, $C_3H_6$, $C_4H_8$, and $C_5H_{10}$, or a combination thereof, and a diluent gas for example an inert gas, such as Ar, He, Ne, Kr, or Xe, or combinations thereof. In some embodiments, the diluent gas comprises an inert gas $N_2$, $H_2$, or combinations thereof. In some embodiments, a ratio of the flowrate, (hereafter ratio), of the hydrocarbon gas to the diluent gas is between about 1:10 and about 10:1, such as between about 1:5 and about 5:1. For example in one embodiment a ratio of $C_2H_2$ to He is between about 1:3 and about 3:1. In some embodiments, the diluent gas comprises $H_2$ and a ratio between $H_2$ and the carbon source gas is between about 0.5:1 and about 1:10, such as between about 1:1 and about 1:5. At activity 203 the method 200 includes maintaining the processing volume at a processing pressure between about 0.1 mTorr and about 100 mTorr, such as between about 0.1 mTorr and about 50 mTorr, between 0.1 mTorr and about 30 mTorr, between about 0.1 mTorr and about 20 mTorr, between about 0.1 mTorr and about 15 mTorr, for example between about 0.1 mTorr and about 10 mTorr, or less than about 100 mTorr, less than about 50 mTorr, less than about 20 mTorr, less than about 15 mTorr, for example about less than about 10 mTorr.

At activity 203 the method 200 includes igniting and maintaining a deposition plasma of the processing gas by applying a first power to one of one or more power electrodes of the processing chamber. Herein, the one or more power electrodes are one of one or more top electrodes (e.g., a chamber lid of the processing chamber or a showerhead disposed in the chamber lid), one or more side electrodes (e.g., one or more sidewalls of the processing chamber), or are part of the substrate support (e.g., one or more electrodes embedded in or coupled to a dielectric material of the substrate support). Typically, the first power is between about 500 W and about 8 kW, such as between about 1000 W and about 5 kW, for a processing chamber sized to process a 300 mm diameter substrate. Appropriate scaling may be used for processing chambers sized to process different sized substrates.

In some embodiments, the one or more power electrodes are one or a combination of embedded in or coupled to a dielectric material of the substrate support. In some embodiments, the first power is an RF or other ac frequency power between about 0.7 W and about 11.3 W per $cm^2$ of a substrate receiving surface of the substrate support, herein $W/cm^2$, such as between about 1.4 $W/cm^2$ and about 7.1 $W/cm^2$, or between about 500 W and about 5 kW for a substrate support having a substrate receiving surface sized to support a 300 mm diameter substrate, such as between about 1000 W and about 5 kW.

In some embodiments, the method 200 further includes applying a second power to one of the one or more power electrodes, where the second power is an RF or other ac frequency power between about 0.14 $W/cm^2$ and about 7.1 $W/cm^2$, such as between about 0.14 $W/cm^2$ and about 3.5 $W/cm^2$, or between about 100 W and about 5 kW, for a substrate support having a substrate receiving surface sized to support a 300 mm diameter substrate, such as between about 100 W and about 2.5 kW. Herein, a frequency of the second power is different from a frequency of the first power. Typically, frequencies of one or both of the first power and the second power are between about 350 kHz and about 100 MHz, such as about 350 KHz, about 2 MHz, about 13.56 MHz, about 27 MHz, about 40 MHz, about 60 MHz, and about 100 MHz. In some embodiments, the first power and the second power are applied to different power electrodes which are electrically isolated from one another, for example dual power electrodes embedded in, and isolated from one another by, a dielectric material of a substrate support. In some embodiments, the first power and the second power are applied to the same power electrode using a conventional impedance matching circuit.

At activity 204 the method 200 includes maintaining the substrate support, and thus the substrate disposed thereon, at a temperature between about −50° C. and about 350° C., such as between about −50° C. and about 150° C., between about −50° C. and about 100° C., or between about −50° C. and about 50° C., for example between about −25° C. and about 25° C. or a temperature less than about 350° C., such as less than about 200° C., less than about 150° C., or less than 100° C., for example less than about 50° C.

At activities 205 and 206 the method 200 respectively includes exposing a surface of the substrate to the deposition plasma and depositing an amorphous carbon layer on the surface of the substrate.

Figure 3:
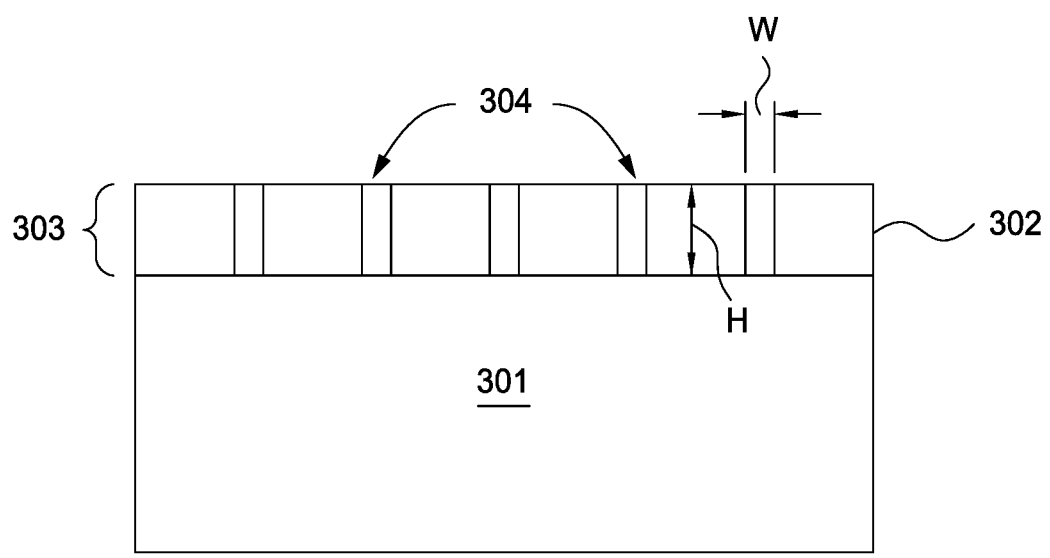
FIG. 3 illustrates a carbon hard mask formed of an amorphous carbon layer deposited according to the method set forth in FIG. 2, according to one embodiment.

FIG. 3 illustrates a carbon hard mask deposited according to the method set forth in FIG. 2, according to one embodiment. In FIG. 3 the carbon hard mask 303, herein a patterned carbon hard mask, includes an amorphous carbon layer 302, having a plurality of openings 304 formed therein, disposed on a to-be-patterned surface of a substrate 300. Typically, the substrate 300 or one or more material layers thereof are formed of one or a combination of crystalline silicon, silicon oxide, silicon oxynitride, silicon nitride, strained silicon, silicon germanium, tungsten, titanium nitride, doped or undoped polysilicon, carbon doped silicon oxides, silicon nitrides, doped silicon, germanium, gallium arsenide, glass, sapphire, and low k dielectric materials.

Herein, the amorphous carbon layer has a thickness between about 1 kÅ and about 40 kÅ, such as between about 10 kÅ and about 40 kÅ, for example between about 10 kÅ and about 30 kÅ, a density of more than about 1.8 $g/cm^3$, a Young's modulus of more than about 50 GPa, and an absorption coefficient (optical K) of less than about 0.15 at a wavelength of about 633 nm. In some embodiments, the amorphous carbon layer has a tensile or compressive film stress of less than about 500 MPa. In some embodiments, the amorphous carbon layer has a tensile film stress of less than about 500 MPa. In some embodiments, each of the openings 304 have an aspect ratio (height to width) of more than about 2:1, such as more than about 3:1, more than about 4:1, more than about 5:1, more than about 6:1, more than about 7:1, more than about 8:1, more than about 9:1, for example more than about 10:1.

The methods described herein provide amorphous carbon layers, and carbon hard masks formed therefrom, having improved density, rigidity, transparency, etch selectivity, and stress when compared to conventionally deposited amorphous carbon layers. Further, the methods described herein are desirably compatible with current carbon hard mask process integration schemes which means that introduction of the methods into existing device manufacturing lines will not require substantial changes in upstream or downstream processing methods or equipment related thereto.

While the foregoing is directed to embodiments of the present disclosure, other and further embodiments of the disclosure may be devised without departing from the basic scope thereof, and the scope thereof is determined by the claims that follow.

The invention claimed is:

1. A method of processing a substrate, comprising:
   positioning a substrate on a substrate support, the substrate support disposed in a processing volume of a processing chamber;
   flowing a processing gas comprising a hydrocarbon gas and a diluent gas into the processing volume, the diluent gas comprising $H_2$, wherein a ratio of the $H_2$ to the hydrocarbon gas in the processing gas is between about 0.5:1 and about 1:10;
   maintaining the processing volume at a processing pressure less than about 100 mTorr;
   igniting and maintaining a deposition plasma of the processing gas by applying a first power to one of one or more power electrodes of the processing chamber;
   maintaining the substrate support at a processing temperature less than about 350° C.;
   exposing a surface of the substrate to the deposition plasma; and
   depositing an amorphous carbon layer on the surface of the substrate, the deposited amorphous carbon layer having a film stress with an absolute value less than about 500 MPa.

2. The method of claim 1, wherein the deposited amorphous carbon layer has a density of more than about 1.8 $g/cm^3$.

3. The method of claim 1, wherein the deposited amorphous carbon layer has a Young's modulus of more than about 50 GPa.

4. The method of claim 1, wherein the deposited amorphous carbon layer has an absorption coefficient (optical K) of less than about 0.15 at a wavelength of about 633 nm.

5. The method of claim 1, wherein the deposited amorphous carbon layer has a density of more than about 1.8 g/cm³, a Young's modulus of more than about 50 GPa, and an absorption coefficient (optical K) of less than about 0.15 at a wavelength of about 633 nm.

6. The method of claim 5, wherein the deposited amorphous carbon layer has a plurality of openings formed therethrough, and wherein each of the plurality of openings have a height to width ratio of more than about 2:1.

7. The method of claim 1, wherein the hydrocarbon gas comprises one of $CH_4$, $C_2H_2$, $C_3H_8$, $C_4H_{10}$, $C_2H_4$, $C_3H_6$, $C_4H_8$, $C_5H_{10}$, or a combination thereof.

8. The method of claim 7, wherein a ratio of hydrocarbon gas to diluent gas is between about 1:10 and about 10:1.

9. The method of claim 7, wherein the processing temperature is less than about 100° C.

10. The method of claim 9, wherein the processing pressure is less than about 20 mTorr.

11. The method of claim 10, wherein each of the one or more power electrodes are part of the substrate support.

12. The method of claim 11, wherein the first power is an ac power between about 0.7 W and about 11.3 W per cm² of a substrate receiving surface of the substrate support, wherein the first power has a frequency between about 350 kHz and about 100 MHz.

13. The method of claim 12, further comprising applying a second power to one of the one or more power electrodes, wherein the second power is an ac power between about 0.14 W and about 11.3 W per cm² of the substrate receiving surface of the substrate support, wherein the second power has a frequency between about 350 kHz and about 100 MHz, and wherein the frequency of the first power is different than the frequency of the second power.

14. The method of claim 1, wherein the processing temperature is less than 0° C.

15. A method of processing a substrate, comprising:
positioning a substrate on a substrate support, the substrate support disposed in a processing volume of a processing chamber;
flowing a processing gas comprising a hydrocarbon gas and a diluent gas into the processing volume, the diluent gas comprising $H_2$ wherein a ratio of the $H_2$ to the hydrocarbon gas in the processing gas is between about 0.5:1 and about 1:10;
maintaining the processing volume at a processing pressure less than about 20 mTorr;
igniting and maintaining a deposition plasma of the processing gas by applying a first ac power to one of one or more power electrodes of the substrate support, wherein the first ac power is between about 0.7 watts and about 15 watts per cm² of a substrate receiving surface of the substrate support;
maintaining the substrate support at a processing temperature less than about 100° C.;
exposing a surface of the substrate to the deposition plasma; and
depositing an amorphous carbon layer on the surface of the substrate, the deposited amorphous carbon layer having a film stress with an absolute value less than about 500 MPa.

16. The method of claim 15, wherein the hydrocarbon gas comprises one of $CH_4$, $C_2H_2$, $C_3H_8$, $C_4H_{10}$, $C_2H_4$, $C_3H_6$, $C_4H_8$, $C_5H_{10}$, or a combination thereof.

17. The method of claim 15 further comprising applying a second ac power to one of the one or more power electrodes of the substrate support, wherein the second ac power is between about 0.14 W and about 7.1 W per cm² of the substrate receiving surface of the substrate support, wherein the first ac power and the second ac power each have a frequency between about 350 kHz and about 100 MHz, and wherein the frequency of the first ac power is different than the frequency of the second ac power.

18. A carbon hard mask, comprising:
an amorphous carbon layer disposed on a surface of a substrate, wherein the amorphous carbon layer has a density of more than about 1.8 g/cm³, a Young's modulus of more than about 50 GPa, a film stress with an absolute value less than about 500 MPa, and an absorption coefficient (optical K) of less than about 0.15 at a wavelength of about 633 nm.

19. The carbon hard mask of claim 18 wherein the amorphous carbon layer has a plurality of openings formed therethrough, and wherein each of the each of the plurality of openings have a height to width ratio of more than about 2:1.

20. The carbon hard mask of claim 19, wherein the height to width ratio of one or more of the plurality of openings is more than about 10:1.

* * * * *